United States Patent [19]

Pan et al.

[11] Patent Number: 4,525,680
[45] Date of Patent: Jun. 25, 1985

[54] MICROWAVE/MILLIMETER WAVE AMPLIFIER WITH RF FEEDBACK

[75] Inventors: Jing-Jong Pan, Melbourne; John B. Wilson, Palm Bay, both of Fla.

[73] Assignee: Harris Corporation, Melbourne, Fla.

[21] Appl. No.: 488,427

[22] Filed: Apr. 22, 1983

[51] Int. Cl.³ .................. H03F 3/193; H03F 3/60
[52] U.S. Cl. .................. 330/277; 330/286; 330/294
[58] Field of Search ........... 330/53, 56, 277, 286, 330/294

[56] References Cited

PUBLICATIONS

Morino et al., "Semiconductor Devices and Circuit Components," *NEC Research & Development*, No. 57, Apr. 1980, pp. 119–129.
Pengelly, "Application of Feedback Techniques to the Realization of Hybrid and Monolithic Broad Band Low-Noise and Power GaAs FET Amplifiers", *Electronics Letters*, Oct. 15, 1981, V. 17, No. 21, pp. 798, 799.

*Primary Examiner*—James B. Mullins
*Attorney, Agent, or Firm*—Antonelli, Terry & Wands

[57] ABSTRACT

An RF MESFET amplifier having a feedback resistor further incorporates two sets of quarter wavelength low impedance pads and quarter wavelength high impedance lines in the resistor feedback path. These RF impedance elements prevent RF feedback as well as thermal noise generated by the feedback resistor from being coupled to the input. Moreover, they effectively isolate RF interaction between the drain and gate of the MESFET; as a result, the amplifier has excellent stability. The low impedance quarter wavelength pads serve as an RF bypass (to ground), while the high impedance quarter wavelength lines provide high attenuation near frequencies at the given wavelength. Consequently, thermal noise generated by the feedback resistor will be bypassed to ground and will not leak into the gate. The value of the feedback resistor can be selected and optimized to obtain the desired VSWR, bandwidth and gain flatness.

25 Claims, 5 Drawing Figures

MICROWAVE/MILLIMETER WAVE AMPLIFIER WITH RF FEEDBACK

FIELD OF THE INVENTION

The present invention relates to amplifiers for high frequency signals and, in particular, is directed to an improved metal semiconductor field effect transistor (MESFET) amplifier for microwave/millimeter wave signals.

BACKGROUND OF THE INVENTION

Advanced technology signalling systems (e.g. communications and electronic warfare (EW) systems) require high performance amplifiers that exhibit high stability, wide bandwidth, low group delay distortion, good phase linearity, low thermal noise, etc. With the introduction of GaAs and other Group III-IV compound semiconductor materials, coupled with submicron fabrication techniques, MESFETS have become especially attractive for millimeter wave, microwave, UHF and VHF amplifiers, and for wideband, linear VCOs for communications and EW applications. However, although a MESFET offers a number of attractive features, enumerated above, its intrinsic input/output impedances produces high input and output VSWRs, causing amplifier instability over a wide frequency range. The high VSWR increases amplifier mismatching power loss, produces a higher noise figure and, for a multistage amplifier, may cause oscillation instability and spurious output signals.

Now, included among conventional approaches for improving the VSWR of an FET are the insertion of circulators upstream and downstream of the MESFET and the use of balanced hybrids. Unfortunately, these proposals inherently decrease the overall gain of the amplifier, while increasing insertion loss, cost, noise figure and physical size. Moreover, they are impractical for millimeter wave amplifier and monolithic microwave integrated circuit (MMIC) applications due to the extreme difficulty in fabricating high performance miniature circulators.

Recent design efforts involving the use of wideband MESFET amplifiers for EW applications have involved the classical feedback approach (employing a resistor and/or inductor) for improving the bandwidth and stability of the amplifier. In early classical feedback schemes, the feedback resistor was used to control the gain and the input and output impedances of a vacuum tube amplifier. (For a more detailed discussion of the basic theory, see F.E. Terman, Radio Engineer's Handbook, McGraw Hill, 1943, pp 395-406, and H.S. Black "Stabilized Feedback Amplifiers" Elect. Eng., Jan. 1934, pp 114-120.) More recent proposals involving the feedback resistor approach include its application to bipolar transistors to achieve wide bandwidth, as detailed in an article by J.B. Coughlin et al, entitled "A Monolithic Silicon Wideband Amplifier from DC to 1 GHz", IEEE Journal of SSC, Dec. 1973, pp 414-419, and using negative feedback to improve the VSWR of a wideband MESFET amplifier, as described in an article by E. Ulrich entitled "Use Negative Feedback to Slash Wideband VSWR", Microwaves, Oct. 1978, pp 66-70. A principal drawback in using such a feedback resistor is the additional thermal noise that is added directly to the amplifier, which reduces system sensitivity and dynamic range. In addition, the finite size of the feedback resistor, connected between the FET gate and drain, often disturbs the FET input and output matching networks, thereby causing a departure from optimum designed values of gain, noise figure, VSWR, etc.

SUMMARY OF THE INVENTION

According to the present invention, the drawbacks of previous attempts to improve the operation of a MESFET amplifier, particularly through the use of a feedback resistor, are remedied by a scheme that not only minimizes the added-on thermal noise generated by the feedback resistor, but which also achieves low VSWR, wide bandwidth, gain flatness, phase linearity and reduced group delay distortion. This significantly enhanced performance is achieved by the use of RF distributed network type coupling components incorporating two sets of quarter wavelength low impedance pads and high impedance lines in the resistor feedback path. These RF impedance elements prevent RF feedback as well as thermal noise generated by the feedback resistor to the input. Moreover, they effectively isolate RF interaction between the drain and gate of the MESFET; as a result, the amplifier has excellent stability. The low impedance quarter wavelength pads serve as an RF bypass (to ground), while the high impedance quarter wavelength lines provide high attenuation near frequencies at the given wavelength. Consequently, thermal noise generated by the feedback resistor will be bypassed to ground and will not leak into the gate. The value of the feedback resistor can be selected and optimized to obtain the desired VSWR, bandwidth and gain flatness. Moreover, if the high impedance lines are made physically thin and cause a small degree of interaction with the input and output matching networks, this interaction can be overcome by connecting the high impedance lines to the least sensitive portions of the matching networks, thus attaining a nearly perfect match.

DETAILED DESCRIPTION

Figure 1:
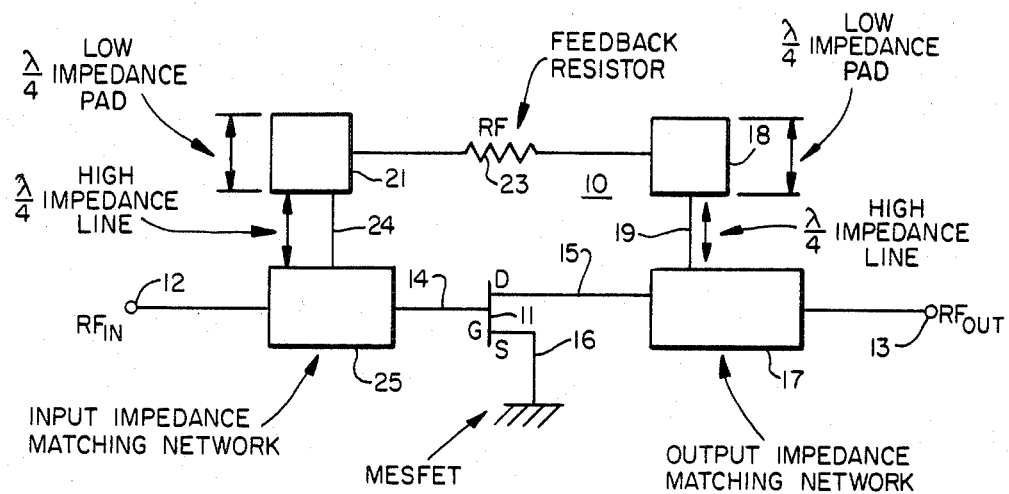
FIG. 1 is a schematic diagram of the improved high performance MESFET amplifier employing an RF resistive feedback network embodying the principles of the present invention.

Referring to FIG. 1 the improved MESFET amplifier according to the present invention is shown as comprising an RF resistor feedback network 10 connected across the gate 14 and drain 15 of a MESFET 11 and being coupled to a pair of RF input and output terminals 12 and 13 respectively. MESFET 11, whose source 16 is connected to ground may be a commercially available component such as an NEC NE 21889 MESFET, which is suitable for applications at 4.4-5.0 GHz. Network 10 consists of RF distributed network type impedance coupling components in the form of a pair of low impedance quarter wavelength pads 18 and 21 and a pair of high impedance quarter wavelength lines 19 and 24 that couple the opposite ends of a feedback resistor 23 to the gate 14 and drain 15 of MESFET 11 via an input impedance matching network 25 and an output impedance matching network 17, respectively. Each of low impedance pads 18 and 21 and high impedance lines 19 and 24 of network 10 is selected for the frequency range of interest and impedance matching networks 17 and 25 are similarly chosen.

Low impedance pads 18 and 21 may comprise a layer of conductive material (e.g. copper) disposed atop a dielectric layer which in turn overlies a conductive ground plane. As shown in FIG. IA the physical configuration of low impedance pads 18 and 21 may be substantially rectangular, having an edge length of $n\lambda g/4$, where $\lambda g$ = guided wavelength and n = 1, 2, 3, .... Similarly, high impedance lines 19 and 24 may comprise quarter wavelength thin strips of conductive material that connect with respective corners 18C and 21C of the low impedance pads 18 and 21, as shown, strips or lines 19 and 24 also overlying the same dielectric layer atop the ground plane on which low impedance pads 18 and 21 are provided.

Impedance matching networks 17 and 25 are also preferably configured of prescribed-shape layers of conductive material that overlie the dielectric layer on which the low and high impedance conductive layers are disposed, thereby facilitating an integrated fabrication of the overall network. The shape of such layers may be suitably selected in a manner familiar to those skilled in the art as L-shaped, $\pi$-shaped, etc. elements to provide the required signal matching at the input and output terminals.

Now, although the values of the components of network 10 may be selected using conventional graph and Smith Chart techniques, once given the frequency range of interest and the characteristics of the MESFET, the choice of these values may also be derived from a computational procedure described below for providing a full understanding of the design and operation of the present invention.

Both the MESFET 11 and the RF feedback network 10 can be represented as a Y matrix. The Y parameters of a two-port network consisting of a MESFET with an associated RF feedback circuit may be defined by:

$$[Y_T] = [Y_{FET} + Y_F] \quad (1)$$

where $Y_{FET}$ is the Y parameter of the MESFET, and
$Y_F$ is the Y parameter of the feedback network.

Since most of the parameters, such as VSWR, gain, isolation, stability factor, etc. of the amplifier are computed from S-parameters, the Y parameter can be converted to S-parameters using equations (2)–(5) as follows:

$$S_{11} = \frac{(1 - Y_{11})(1 + Y_{22}) + Y_{12} Y_{21}}{\Delta Y}, \quad (2)$$

$$S_{12} = \frac{-2 Y_{12}}{\Delta Y}, \quad (3)$$

$$S_{21} = \frac{-2 Y_{21}}{\Delta Y}, \quad (4)$$

and $$S_{22} = \frac{(1 + Y_{11})(1 - Y_{22}) + Y_{12} Y_{21}}{\Delta Y}, \quad (5)$$

where $$\Delta Y = (1 + Y_{11})(1 + Y_{22}) - Y_{12} Y_{21}. \quad (6)$$

Figure 2:
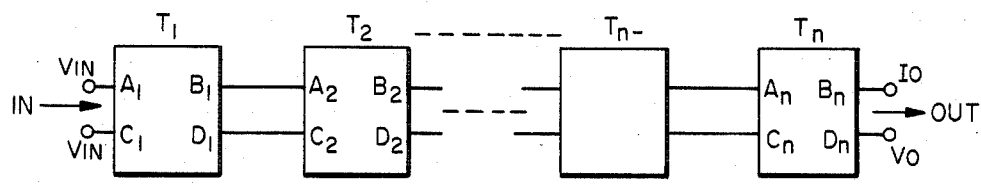
FIG. 2 shows a schematic block diagram of a cascaded arrangement of transmission matrices $T_1 \ldots T_n$.
Figure 1A:
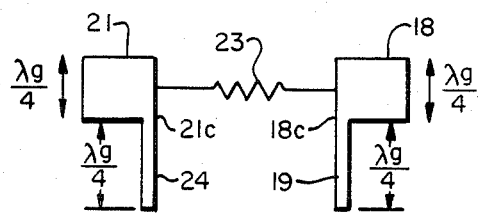
FIG. 1A is a plane view of an exemplary physical configuration of feedback network 10 of the amplifier of FIG. 1.

As shown in FIGS. 1 and 1A, the feedback network 10 consists of a serial connection of $\lambda g/4$ high impedance line 24 —$\lambda g/4$ low impedance pad—resistor 23—$\lambda g/4$ low impedance pad 18—$\lambda g/4$ high impedance line 19. While the parameters of the network can be easily computed, consider the more general case wherein the RF feedback network is comprised of n cascaded sections $T_1, T_2, \ldots, T_n$ of respective [ABCD] matrices as shown in FIG. 2. Since neither the S-parameter nor the Y parameter can be used to perform matrix multiplication for cascaded networks, the quantity T, or chain parameter, will be used. The total ABCD matrix of n-sections may be defined by:

$$[T_T] = [T_1] \cdot [T_2] \cdots [T_n] \quad (7)$$

For a given transmission line section, l, with a characteristic impedance of $Z_0$ and a propagation constant $\gamma$, the transmission parameter T becomes $$T = \begin{bmatrix} A & B \\ C & D \end{bmatrix} = \begin{bmatrix} \cosh\gamma l & Z_0 \sinh\gamma l \\ \dfrac{\sinh\gamma l}{Z_0} & \cosh\gamma l \end{bmatrix} \quad (8)$$

Figure 3:
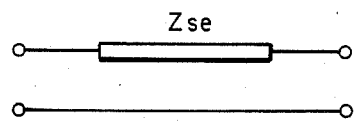
FIG. 3 shows a schematic representation of a series transmission line impedance $Z_{se}$.

For a series impedance transmission line $Z_{se}$, shown in FIG. 3, we have $$T = \begin{bmatrix} 1 & Z_{se} \\ 0 & 1 \end{bmatrix} \quad (9)$$

Figure 4:
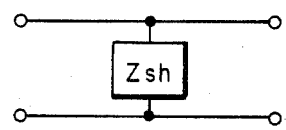
FIG. 4 shows a schematic representation of a shunt transmission line impedance $Z_{sh}$.

For a shunt impedance element $Z_{sh}$ shown in FIG. 4, we have $$T = \begin{bmatrix} 1 & 0 \\ 1/Z_{sh} & 1 \end{bmatrix} \quad (10)$$

If the RF feedback elements have been defined, then the $(T_T)$ of a feedback network can be determined using equations (7) and (8). Then, the matrix $(T_T)$ can be converted to an S matrix using:

$$S_{11} = \frac{T_{11} + T_{12} - T_{21} - T_{22}}{\Delta T} \quad (11)$$

$$S_{21} = \frac{2}{\Delta T} \quad (12)$$

$$S_{12} = \frac{2(T_{11} T_{22} - T_{12} T_{21})}{\Delta T} \quad (13)$$

and $$S_{22} = \frac{-T_{11} + T_{12} - T_{21} + T_{22}}{\Delta T} \quad (14)$$

where $$\Delta T = T_{11} + T_{12} + T_{21} + T_{22} \quad (15)$$

The S-parameters can be translated into Y-parameters by:

$$Y_{11} = \frac{(1 + S_{22})(1 - S_{11}) + S_{12} S_{21}}{\Delta S} \quad (16)$$

-continued $$Y_{12} = \frac{-2 S_{12}}{\Delta S} \quad (17)$$

$$Y_{21} = \frac{-2 S_{12}}{\Delta S} \quad (18)$$

$$Y_{22} = \frac{(1 + S_{11})(1 - S_{22}) + S_{12} S_{21}}{\Delta S} \quad (19)$$

where $$\Delta S = (1 + S_{11})(1 + S_{22}) - S_{12} S_{21} \quad (20)$$

Finally, the newly converted ($Y_F$) matrix can be directly paralleled with the MESFET's (Y) matrix using equation (1).

With the configuration of the invention shown in FIGS. 1 and 1A and defined as in the foregoing analysis, it is possible to easily achieve a good stability factor (larger than 2) and VSWRs (better than 1.5:1) over an octave of bandwidth. For example, using the commercially available component (NEC NE 21889) for MESFET 11, referenced above and operated over a 4.4–5.0 GHz range, the single stage MESFET amplifier shown in FIG. 1 has a typical performance as follows: gain: 10±0.25 dB; input VSWR: 1.2:1; output VSWR: 1.2:1; and noise FIG. 1.8 db.

It should also be noted that the RF feedback scheme of the present invention may be applied to a multistage amplifier configuration. Namely, in the embodiment of FIG. 1, the single MESFET stage may be replaced by a plurality of such MESFETs connected in cascade, with the RF feedback network connected across the overall cascaded arrangement.

As mentioned previously, each of the components of the MESFET amplifier having an RF feedback network as shown in FIG. 1 may be selected from those commercially available and thus may be implemented using RF distributed network type impedance coupling components microstrip, stripline, finline, suspended stripline (or microstrip) and coplanar waveguide. Moreover, the quarter wavelength high and low impedance lines may be replaced by RF filters, preferably bandpass because of its low noise advantage. Still, the above enumerated benefits of the invention including good stability, low thermal noise, low insertion loss, low group delay, good phase linearity, wide bandwidth, as well as increased power handling and intermodulation capability performance and reduced dependency on FET S-parameter variations are afforded. The reduced dependency on the FET S-parameter is especially noteworthy, as it permits the same feedback network to be used with a variety of MESFET components.

Namely, in the above example, a suitable choice for MESFET 11 has been described as an NEC NE 21889 MESFET. However, this component may be replaced by other transistors whose characteristics are not identical to those of the replaced MESFET without impairing the operation of the amplifier. This means that the network need not be individually tailored (redesigned) for a change in active element (MESFET). Instead, it is a simple matter of dropping out the MESFET to be replaced and inserting a new transistor into the circuit.

While we have shown and described an embodiment in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

What is claimed is:

1. A microwave field effect transistor (FET) amplifier circuit comprising
   an input terminal;
   an output terminal;
   at least one microwave FET stage coupled between said input terminal and said output terminal; and
   a feedback network coupled between said output terminal and said input terminal, said feedback network including a feedback resistor and RF distributed network type impedance means including a low impedance network element for coupling said resistor to said output and input terminals.

2. A microwave FET amplifier circuit according to claim 1, wherein said at least one microwave FET stage comprises a MESFET.

3. A microwave FET amplifier circuit according to claim 1, wherein said RF distributed network type impedance coupling means of said feedback network comprises a quarter wavelength high impedance line and, as said low impedance network element, a quarter wavelength low impedance pad, coupled between one end of said resistor and one of said output and input terminals.

4. A microwave FET amplifier circuit according to claim 1, wherein said RF distributed network type impedance coupling means comprises respective sets of quarter wavelength high impedance line and, as said low impedance network element, a respective quarter wavelength low impedance pad, coupled between respective ends of said resistor and respective ones of said output and input terminals.

5. A microwave FET amplifier circuit according to claim 1, further including respective impedance matching networks coupled between respective ones of said terminals, said feedback network and said at least one transistor stage.

6. A microwave FET amplifier circuit according to claim 1, wherein said at least one microwave FET stage comprises a microwave FET having a gate electrode coupled to said input terminal, and source and drain electrodes, one of said source and drain electrodes being coupled to said output terminal and the other of said source and drain electrodes being coupled to a reference potential terminal.

7. A microwave FET amplifier circuit according to claim 1, wherein said RF distributed network type impedance coupling means further includes a high impedance network element coupled between said low impedance network element and one of said input and output terminals.

8. A microwave FET amplifier circuit according to claim 7, wherein said low impedance network element comprises a quarter wavelength low impedance pad and said high impedance element comprises a quarter wavelength high impedance line coupling said quarter wavelength low impedance pad to said one of said input and output terminals.

9. A microwave FET amplifier circuit according to claim 1, wherein said RF distributed type impedance means comprises respective low impedance network elements coupled between opposite ends of said feedback resistor and said input and output terminals.

10. A microwave FET amplifier circuit according to claim 9, wherein each of said low impedance network elements comprises a quarter wavelength low impedance pad.

11. A high frequency transistor amplifier circuit comprising:
   an input terminal to which high frequency signals to be amplified are to be applied;
   an output terminal from which high frequency signals amplified by said amplifier circuit may be derived;
   at least one high frequency transistor stage coupled between said input terminal and said output terminal; and
   a feedback network coupled between said output terminal and said input terminal, said feedback network including a feedback resistor and high frequency impedance means for coupling said resistor to said terminals, for bypassing thermal noise generated by said resistor away from said at least one high frequency transistor stage, and for providing high attenuation near the frequency of said high frequency signal.

12. A high frequency transistor amplifier circuit according to claim 11, wherein said high frequency impedance means comprises a pair of high impedance quarter wavelength lines coupled between opposite ends of said resistor and said terminals for providing said high attenuation.

13. A high frequency transistor amplifier circuit according to claim 12, wherein said high frequency impedance means further comprises a pair of low impedance quarter wavelength pads coupled between opposite ends of said resistor and a reference potential terminal for providing a high frequency, thermal noise bypass away from said at least one high frequency transistor stage.

14. A high frequency transistor amplifier circuit according to claim 13, wherein said at least one high frequency transistor stage comprises a high frequency field effect transistor.

15. A high frequency transistor amplifier circuit according to claim 13, wherein said at least one high frequency transistor stage comprises a microwave FET.

16. A high frequency transistor amplifier circuit according to claim 15, further including respective impedance matching networks coupled between respective ones of said terminals, said feedback network and said at least one high frequency transistor stage.

17. A high frequency transistor amplifier circuit according to claim 16, wherein said at least one microwave FET stage comprises a microwave FET having a gate electrode coupled to said input terminal, and source and drain electrodes, one of said source and drain electrodes being coupled to said output terminal and the other of said source and drain electrodes being coupled to a reference potential terminal.

18. A high frequency transistor amplifier circuit according to claim 11, wherein said high frequency impedance means comprises a pair of low impedance quarter wavelength pads coupled between opposite ends of said resistor and a reference potential terminal for providing a high frequency, thermal noise bypass away from said at least one high frequency transistor stage.

19. A high frequency transistor amplifier circuit comprising:
   an input terminal;
   an output terminal;
   a high frequency field effect transistor disposed between said input terminal and said output terminal; and
   a feedback network coupled between said output terminal and said input terminal, said feedback network including a feedback element and high frequency impedance means for coupling said element to said terminals, for bypassing noise away from said transistor, and for providing high attenuation near the frequency of high frequency signals to be amplified.

20. A high frequency transistor amplifier circuit according to claim 14, wherein said high frequency impedance means comprises a pair of high impedance quarter wavelength lines coupled between opposite ends of said element and said terminals for providing said high attenuation.

21. A high frequency transistor amplifier circuit according to claim 20, wherein said high frequency impedance means further comprises a pair of low impedance quarter wavelength pads coupled between opposite ends of said element and a reference potential terminal for providing a noise bypass away from said transistor.

22. A high frequency transistor amplifier circuit according to claim 21, wherein said element comprises a resistor.

23. A high frequency transistor amplifier circuit according to claim 22, wherein said transistor comprises a microwave MESFET.

24. A high frequency transistor amplifier circuit according to claim 23, wherein said high frequency signals comprise RF signals.

25. A high frequency transistor amplifier circuit according to claim 14, wherein said high frequency impedance means comprises a pair of low impedance quarter wavelength pads coupled between opposite ends of said element and a reference potential terminal for providing a noise bypass away from said transistor.

* * * * *